(12) United States Patent
Lee

(10) Patent No.: US 8,781,139 B2
(45) Date of Patent: Jul. 15, 2014

(54) SPEAKER SYSTEM AND SPEAKER DRIVING CIRCUIT

(75) Inventor: Fang Ching Lee, Taoyuan County (TW)

(73) Assignee: HTC Corporation, Taoyuan County (TW)

( * ) Notice: Subject to any disclaimer, the term of this patent is extended or adjusted under 35 U.S.C. 154(b) by 593 days.

(21) Appl. No.: 12/979,888

(22) Filed: Dec. 28, 2010

(65) Prior Publication Data

US 2011/0158433 A1 Jun. 30, 2011

(30) Foreign Application Priority Data

Dec. 31, 2009 (TW) .............................. 98146152 A

(51) Int. Cl.
*H03G 3/00* (2006.01)
*H04R 1/00* (2006.01)
*H03F 99/00* (2009.01)

(52) U.S. Cl.
USPC .......................... 381/107; 381/182; 381/120

(58) Field of Classification Search
USPC ..................... 381/107, 120, 121, 28, 99, 111, 381/116–117
See application file for complete search history.

(56) References Cited

U.S. PATENT DOCUMENTS

| | | | | |
|---|---|---|---|---|
| 3,040,613 A * | 6/1962 | Tennes | .............................. | 84/705 |
| 3,286,034 A * | 11/1966 | Rypkema | .......................... | 381/11 |
| 3,588,355 A * | 6/1971 | Holm | .............................. | 381/308 |
| 4,289,936 A * | 9/1981 | Civitello | ........................ | 381/116 |
| 4,684,899 A * | 8/1987 | Carpentier | ..................... | 330/149 |
| 4,955,059 A * | 9/1990 | Mech | .............................. | 381/116 |
| 5,498,997 A * | 3/1996 | Schiebold | ...................... | 330/277 |
| 6,028,943 A * | 2/2000 | Nagata | ............................ | 381/111 |
| 6,961,438 B1 * | 11/2005 | Fujita | ............................. | 381/182 |
| 2005/0226441 A1 * | 10/2005 | Tanaka et al. | ................... | 381/99 |
| 2008/0247570 A1 * | 10/2008 | Lin et al. | ........................ | 381/104 |
| 2010/0124342 A1 | 5/2010 | Lee et al. | | |

FOREIGN PATENT DOCUMENTS

| | | | | |
|---|---|---|---|---|
| CN | 1525789 A | 9/2004 | | |
| CN | 1767378 A | 5/2006 | | |
| EP | 1998592 A1 * | 12/2008 | ............... | H03G 9/14 |
| FR | 2532139 A1 | 2/1984 | | |
| GB | 2422265 A | 7/2006 | | |
| JP | 58225797 A | 12/1983 | | |
| JP | 2001061196 A | 3/2001 | | |
| WO | WO 2007119362 A1 * | 10/2007 | ............... | H03G 9/14 |

OTHER PUBLICATIONS

Office Action issued in corresponding Chinese application dated Mar. 27, 2013.

* cited by examiner

*Primary Examiner* — Vivian Chin
*Assistant Examiner* — Leonard M Giannone
(74) *Attorney, Agent, or Firm* — Lowe Hauptman & Ham, LLP

(57) ABSTRACT

A speaker system includes a first speaker, a second speaker and a driving circuit. The first speaker and the second speaker are different types of speakers. The driving circuit drives the first speaker with a first driving voltage and a first driving current and drives the second speaker with a second driving voltage and a second driving current, wherein the first driving voltage is larger than the second driving voltage and the first driving current is smaller than the second driving current. The present disclosure further provides a speaker driving circuit.

15 Claims, 2 Drawing Sheets

SPEAKER SYSTEM AND SPEAKER DRIVING CIRCUIT

CROSS REFERENCE TO RELATED APPLICATION

This application claims the priority benefit of Taiwan Patent Application Serial Number 098146152, filed on Dec. 31, 2009, the full disclosure of which is incorporated herein by reference.

BACKGROUND

1. Field of the Invention

This disclosure generally relates to a speaker system and a speaker driving circuit and, more particularly, to a hybrid speaker system and a hybrid speaker driving circuit.

2. Description of the Related Art

Presently, speakers can be mainly divided into the coil speaker, the piezoelectric speaker and the capacitive speaker according to different driving methods. The coil speaker is a mature technology and is the most widely used speaker. Generally, an AB class or a D class amplifier is used as a driving circuit for the coil speaker. FIG. 1 shows a schematic diagram of driving a coil speaker CS with an AB class or D class amplifier 9. Based on the operational characteristic of the coil speaker CS, the amplifier 9 has to provide driving signals with low voltage (about 1 to 10 Vrms) and high current (about 0.1 to 1 Ampere).

The capacitive speaker has a superior sound quality than other types of speakers. However, the driving circuit used to drive a capacitive speaker has to provide driving signals with high voltage (more than 100 Vrms) and low current (about 0.1 A), which is just opposite to that used to drive a coil speaker.

Generally speaking, the coil speaker has better operational characteristic in low frequency band while the capacitive speaker has better operational characteristic in middle and high frequency bands. Therefore, it is a choice to improve the sound quality of a speaker system by integrating the coil speaker and the capacitive speaker into a system. However, as the coil speaker and the capacitive speaker have different driving characteristics as mentioned above, it is necessary to propose a driving circuit that can simultaneously drive two types of speakers and a speaker system that uses two different types of speakers.

SUMMARY

The present disclosure provides a hybrid speaker driving circuit that can drive a coil speaker and a capacitive speaker simultaneously.

The present disclosure further provides a speaker system that includes a coil speaker and a capacitive speaker.

The present disclosure provides a speaker system including a first speaker, a second speaker and a driving circuit. The first speaker and the second speaker are different types of speakers. The driving circuit drives the first speaker with a first driving voltage and a first driving current and drives the second speaker with a second driving voltage and a second driving current; wherein the first driving voltage is larger than the second driving voltage and the first driving current is smaller than the second driving current.

The present disclosure further provides a speaker driving circuit configured to simultaneously drive two different types of speakers. The speaker driving circuit includes an amplification unit, a first drive terminal and a second drive terminal. The amplification unit is configured to receive an audio signal and to output an amplified signal according to the audio signal. The first drive terminal is coupled to the amplification unit and configured to receive the amplified signal and to provide a first driving voltage and a first driving current to a first speaker according to the amplified signal. The second drive terminal is connected to the first drive terminal in parallel, coupled to the amplification unit to receive the amplified signal and configured to provide a second driving voltage and a second driving current to a second speaker according to the amplified signal; wherein the first driving voltage is larger than the second driving voltage and the first driving current is smaller than the second driving current.

In an embodiment of the present disclosure, the first drive terminal further includes a voltage conversion unit and a protection and matching unit. The voltage conversion unit provides the first driving voltage and the first driving current to the first speaker. The protection and matching unit is coupled between the amplification unit and the voltage conversion unit for impedance matching between the amplification unit and the voltage conversion unit, and configured to limit a total current flowing through the amplification unit to protect the amplification unit.

The present disclosure further provides a speaker system including a capacitive speaker, a coil speaker and a driving circuit. The driving circuit includes a D class or AB class amplifier for simultaneously driving the capacitive speaker and the coil speaker.

The speaker system of the present disclosure further includes a voltage conversion unit and a protection and matching unit. The voltage conversion unit is coupled to the capacitive speaker to drive the capacitive speaker. The protection and matching unit is coupled between the voltage conversion unit and the D class or AB class amplifier for impedance matching between the voltage conversion unit and the D class or AB class amplifier, and configured to limit a total current flowing through the D class or AB class amplifier to protect the D class or AB class amplifier.

In the speaker system and the speaker driving circuit of the present disclosure, the amplification unit may be a single-ended amplifier or a differential amplifier. The protection and matching unit may be coupled to one or both of the two output terminals of the amplification unit.

In addition, in the speaker system and the speaker driving circuit of the present disclosure, in order to increase the sound quality of the first speaker and the second speaker, a sound quality adjustment unit, e.g. an equalizer and/or an auto gain controller or a dynamic range controller, may be disposed respectively between the amplification unit and the first speaker and between the amplification unit and the second speaker, or a sound quality adjustment unit, e.g. an auto gain controller or a dynamic range controller, may further be selectively disposed in front of the input terminal of the amplification unit.

By using the speaker driving circuit of the present disclosure, a traditional AB class or D class amplifier may be used to simultaneously drive two different types of speakers to improve the sound quality of a speaker system.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noticed that, wherever possible, the same reference numbers will be used throughout the drawings to refer to the same or like parts.

Figure 1:
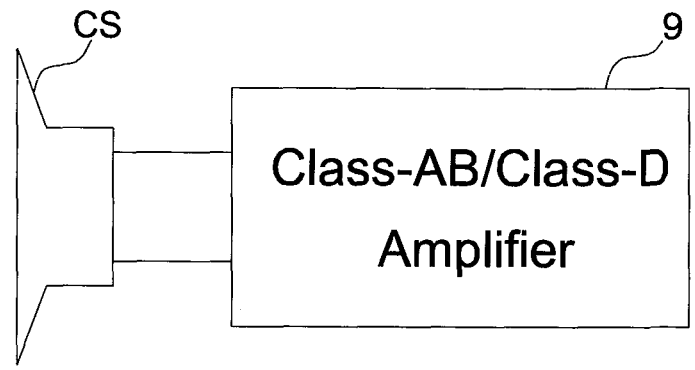
FIG. 1 shows a schematic diagram of a conventional coil speaker system.
Figure 2:
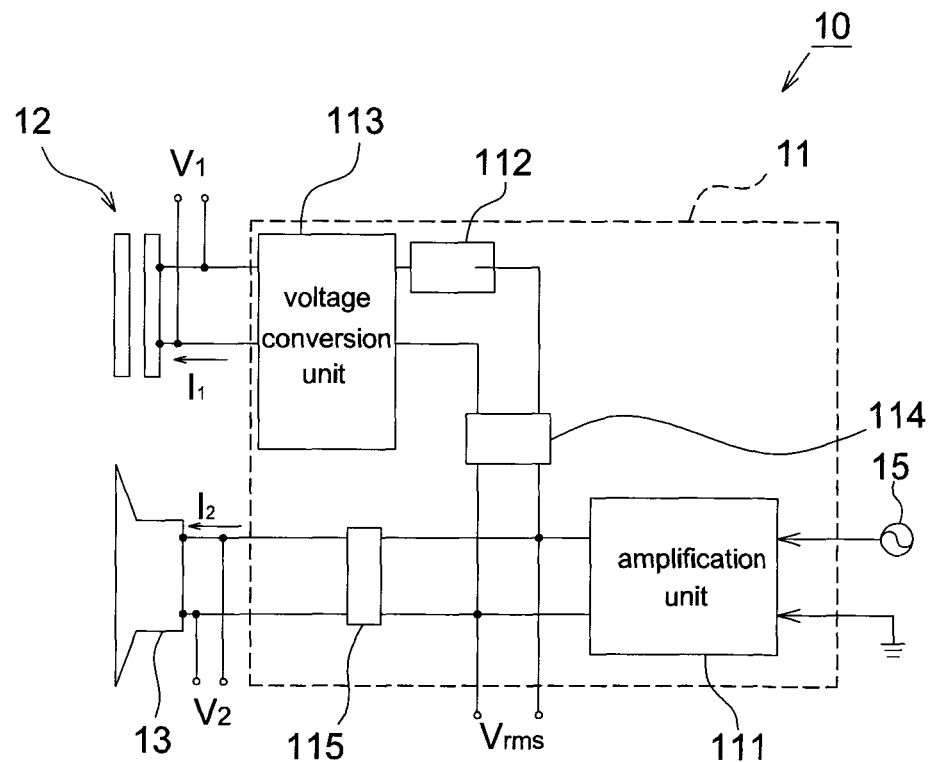
FIG. 2 shows a block diagram of the speaker system according to the first embodiment of the present disclosure.

Please refer to FIG. 2, it shows a schematic diagram of the speaker system 10 according to the first embodiment of the present disclosure. The speaker system 10 includes a speaker driving circuit 11, a first speaker 12 and a second speaker 13.

The speaker driving circuit 11 provides a first driving voltage $V_1$ and a first driving current $I_1$ to drive the first speaker 12. The speaker driving circuit 11 provides a second driving voltage $V_2$ and a second driving current $I_2$ to drive the second speaker 13 as well, wherein the first driving voltage $V_1$ is much larger (preferably at least 10 times) than the second driving voltage $V_2$ and the first driving current $I_1$ is smaller than the second driving current $I_2$. The first speaker 12 and the second speaker 13 are different types of speakers, e.g. the first speaker 12 may be a capacitive speaker and the second speaker 13 may be a coil speaker.

The speaker driving circuit 11 includes an amplification unit 111, a protection and matching unit 112, a voltage conversion unit 113, a first sound quality adjustment unit 114 and a second sound quality adjustment unit 115, wherein the first sound quality adjustment unit 114 and the second sound quality adjustment unit 115 may not be implemented or only one of the first sound quality adjustment unit 114 and the second sound quality adjustment unit 115 is implemented according to different embodiments. The amplification unit 11 may be, for example, an AB class or D class audio amplifier. In this embodiment, the amplification unit 111 may be a single-ended amplifier for receiving an audio signal 15 and outputting an amplified signal according to the audio signal, wherein the voltage value of the amplified signal may be a root mean square voltage value Vrms herein. In addition, the amplification unit 111 may be an amplifier manufactured by IC manufacturing processes and configured to drive a first drive terminal and a second drive terminal connected in parallel. The first drive terminal is coupled to the amplification unit 111 and configured to receive the amplified signal and to provide the first driving voltage $V_1$ and the first driving current $I_1$ to the first speaker 12 according to the amplified signal. The first drive terminal includes the voltage conversion unit 113, the protection and matching unit 112 and the first sound quality adjustment unit 114. The second drive terminal is connected to the first drive terminal in parallel, coupled to the amplification unit 111 to receive the amplified signal and configured to provide the second driving voltage $V_2$ and the second driving current $I_2$ to the second speaker 13 according to the amplified signal. The second drive terminal includes the second sound quality adjustment unit 115.

The protection and matching unit 112 is coupled between the amplification unit 111 and the voltage conversion unit 113, and it may be made by one or a combination of resistor, inductor and capacitor. For example, but not limited to, the protection and matching unit 112 may be made by connecting an inductor and a capacitor in series. The protection and matching unit 112 limits a total current flowing through the amplification unit 111 so as to perform over current protection on the amplification unit 111, such that the amplification unit 111 will not be damaged by high current. In addition, the protection and matching unit 112 is also used for impedance matching between the amplification unit 111 and the voltage conversion unit 113. For example, an input resistance of the second speaker 13 is 4 to 16 ohms; an input resistance of the first speaker 12 is larger than 1 million ohms; and an input resistance of the voltage conversion unit 113 is 0.5 to 16 ohms and an output resistance thereof is larger than 300 ohms. Therefore, an input resistance of the protection and matching unit 112 is preferably equal to 1 to 4 ohms to have the input resistance of the second drive terminal be substantially equal to the input resistance of the first drive terminal. In this manner, the amplification unit 11 is substantially drive two parallel speakers having identical input resistances simultaneously. Therefore, the speaker driving circuit 11 is able to simultaneously drive two different speakers, e.g. the first speaker 12 and the second speaker 13, having different characteristics.

The voltage conversion unit 113 is configured to provide the first driving voltage $V_1$ and the first driving current $I_1$ to drive the first speaker 12. The voltage conversion unit 113 may be a step-up transformer or a voltage booster. When the voltage conversion unit 113 is a voltage booster, it may be formed by integrated circuit or operators. The voltage conversion unit 113 may, for example, boost an input voltage Vrms to 35×Vrms, that is, the first driving voltage is 35 times of an output voltage of the amplification unit 111, but this is not a limitation. In the present disclosure, the voltage conversion unit 113 has high output impedance. When the frequency of the driving signal is higher, the output impedance becomes higher to improve the energy conversion efficiency so that a better driving performance can be achieved in driving the first speaker 12.

The first sound quality adjustment unit 114 is coupled between the protection and matching unit 112 and the amplification unit 111, and the second sound quality adjustment unit 115 is coupled between the second speaker 13 and the amplification unit 111. The first sound quality adjustment unit 114 and the second sound quality adjustment unit 115 are respectively configured to adjust audio signals inputted into the first speaker 12 and the second speaker 13. The first sound quality adjustment unit 114 and the second sound quality adjustment unit 115 may, for example, include an equalizer and/or an auto gain controller or a dynamic range controller, wherein the equalizer may be, for example, a high pass filter or a low pass filter to filter the audio signals; the auto gain controller may provide small signals inside the audio signals with a larger gain and provide large signals inside the audio signals with a smaller gain so as to reduce the energy difference between different frequencies; and the dynamic range controller is also configured to reduce the energy difference between different frequencies. The capacitive speaker has better operational characteristic in middle and high frequency bands while the coil speaker has better operational characteristic in low frequency bands. Therefore, if the first speaker 12 is a capacitive speaker, the equalizer included in the first sound quality adjustment unit 114 is preferably a high pass filter so as to remove low frequency components in the audio signals. If the second speaker 13 is a coil speaker, the equalizer included in the second sound quality adjustment unit 115 is preferably a low pass filter so as to remove middle and high frequency components in the audio signals. As mentioned above, the speaker driving circuit 11 may not include the first sound quality adjustment unit 114 and the second sound quality adjustment unit 115 or may include only one of them.

Figure 3:
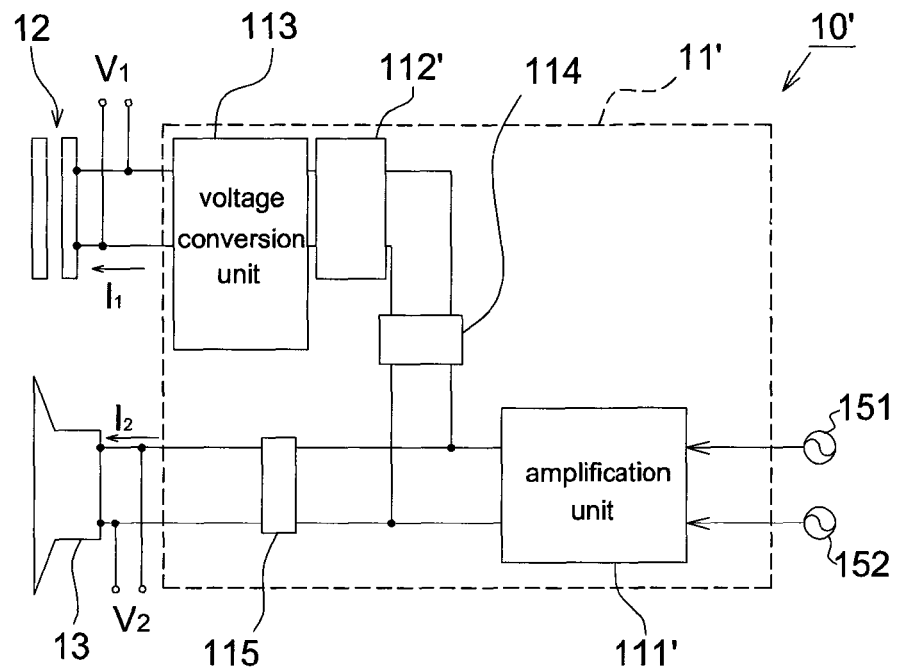
FIG. 3 shows a block diagram of the speaker system according to the second embodiment of the present disclosure.

Please refer to FIG. 3, it shows the speaker system 10' according to the second embodiment of the present disclosure, which includes a speaker driving circuit 11', the first speaker 12 and the second speaker 13, wherein the first speaker 12 and the second speaker 13 are identical to those in the first embodiment and thus details thereof will not be repeated herein. The speaker driving circuit 11' includes an amplification unit 111', a protection and matching unit 112', the voltage conversion unit 113, the first sound quality adjustment unit 114 and the second sound quality adjustment unit 115, wherein the voltage conversion unit 113, the first sound quality adjustment unit 114 and the second sound quality adjustment unit 115 are identical to those in the first embodiment and thus details thereof will not be repeated herein. Similarly, in the present embodiment, the first sound quality adjustment unit 114 and the second sound quality adjustment unit 115 may not be implemented or only one of them is implemented. Differences between this embodiment and the first embodiment are that, in the present embodiment the amplification unit 111' is a differential amplifier configured to receive a couple of audio signals 151 and 152; and the protection and matching unit 112' may be single-ended or two-ended, wherein the term "single-ended" herein refers that the protection and matching unit 112' is coupled to one of the two output terminals of the amplification unit 111', and the term "two-ended" herein refers that the protection and matching unit 112' is coupled to both of the two output terminals of the amplification unit 111'.

Figure 4:
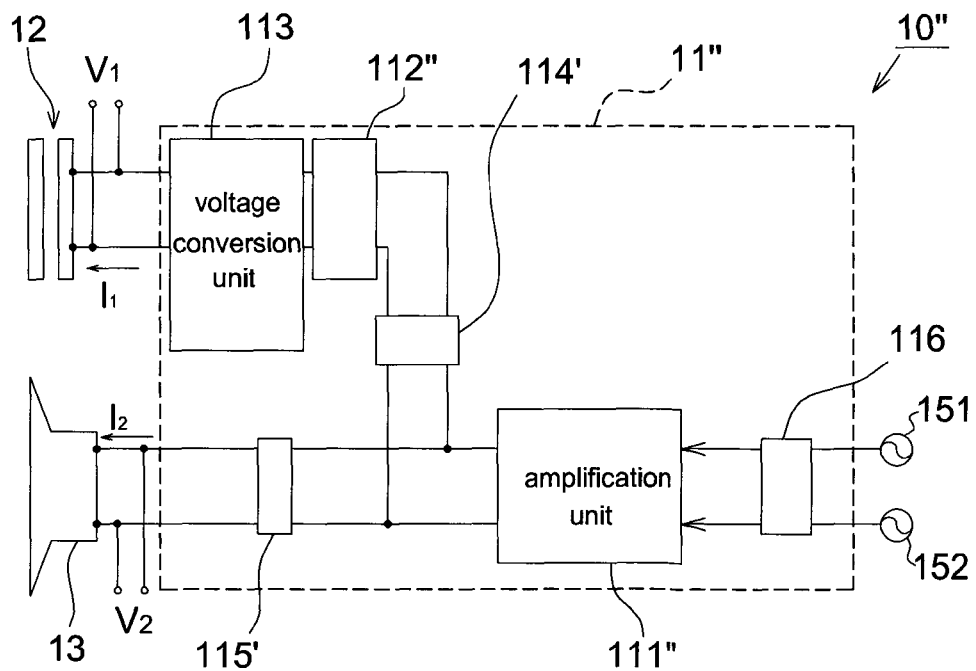
FIG. 4 shows a block diagram of the speaker system according to the third embodiment of the present disclosure.

Please refer to FIG. 4, it shows the speaker system 10" according to the third embodiment of the present disclosure, which includes a speaker driving circuit 11", the first speaker 12 and the second speaker 13, wherein the first speaker 12 and the second speaker 13 are identical to those in the first embodiment and thus details thereof will not be repeated herein. The speaker driving circuit 11" includes an amplification unit 111", a protection and matching unit 112", the voltage conversion unit 113, a first sound quality adjustment unit 114', a second sound quality adjustment unit 115' and a third sound quality adjustment unit 116, wherein the voltage conversion unit 113 is identical to that in the first embodiment and thus details thereof will not be repeated herein. Differences between this embodiment and the first embodiment are that, in the present embodiment the first sound quality adjustment unit 114' and the second sound quality adjustment unit 115' are equalizers; and the third sound quality adjustment unit 116 is disposed in front of the input terminal of the amplification unit 111", and may be, for example, an auto gain controller or a dynamic range controller configured to receive the audio signals 151 and 152 or to receive the audio signal 15 as shown in FIG. 2. In addition, in the present embodiment, the amplification unit 111" may be a differential amplifier or a single-ended amplifier. The protection and matching unit 112" may be single-ended or two-ended, wherein if the amplification unit 111" is a single-ended amplifier, the protection and matching unit 112" is preferably single-ended; and if the amplification unit 111" is a differential amplifier, the protection and matching unit 112" may be single-ended or two-ended. The meaning of the terms "single-ended" and "two-ended" herein is similar to that explained in the second embodiment above.

As mentioned above, as the conventional speaker driving circuit is not able to simultaneously drive two different types of speakers, there is a limitation in improving the sound quality of the speaker system. The present disclosure further provides a speaker system and a speaker driving circuit that can simultaneously drive a coil speaker and a capacitive speaker by using a conventional D class or AB class amplifier (as shown in FIGS. 2-4) so as to effectively improve the sound quality played by a speaker system.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A speaker system, comprising:
    a capacitive speaker;
    a coil speaker; and
    a driving circuit configured to drive the capacitive speaker and the coil speaker simultaneously, the driving circuit comprising:
        a D class or AB class amplifier configured to receive an audio signal and to output an amplified signal having an output voltage according to the audio signal;
        a first drive terminal coupled to the D class or AB class amplifier for receiving the amplified signal, the first drive terminal having a voltage conversion unit and a protection and matching unit, wherein
            the voltage conversion unit is configured to boost the output voltage to a first driving voltage, which is higher than the output voltage, and provide the first driving voltage and a first driving current to the capacitive speaker according to the amplified signal, and
            the protection and matching unit is coupled between the D class or AB class amplifier and the voltage conversion unit for impedance matching between the D class or AB class amplifier and the voltage conversion unit, the protection and matching unit configured to limit a total current flowing through the D class or AB class amplifier; and
        a second drive terminal connected to the first drive terminal in parallel and coupled to the D class or AB class amplifier, the second drive terminal configured to receive the amplified signal and to provide a second driving voltage and a second driving current to the coil speaker according to the amplified signal;
    wherein the first driving voltage is larger than the second driving voltage and the first driving current is smaller than the second driving current.

2. The speaker system as claimed in claim 1, wherein the D class or AB class amplifier is a single-ended amplifier or a differential amplifier.

3. The speaker system as claimed in claim 1, wherein the voltage conversion unit is a step-up transformer or a voltage booster.

4. The speaker system as claimed in claim 1, wherein
    the first drive terminal further comprises a first sound quality adjustment unit coupled between the protection and matching unit and the D class or AB class amplifier, and
    the second drive terminal further comprises a second sound quality adjustment unit coupled between the coil speaker and the D class or AB class amplifier.

5. The speaker system as claimed in claim 4, wherein each of the first sound quality adjustment unit and the second sound quality adjustment unit further comprises at least one of
    an equalizer, and
    an auto gain controller or a dynamic range controller.

6. The speaker system as claimed in claim 4, wherein the driving circuit further comprises a third sound quality adjustment unit coupled to an input terminal of the D class or AB class amplifier.

7. The speaker system as claimed in claim 6, wherein the first sound quality adjustment unit and the second sound quality adjustment unit are equalizers, and the third sound quality adjustment unit is an auto gain controller or a dynamic range controller.

8. The speaker system as claimed in claim 1, wherein the protection and matching unit comprises at least one selected from the group consisting of resistor, capacitor and inductor.

9. The speaker system as claimed in claim 1, wherein the D class or AB class amplifier has two output terminals, and the protection and matching unit is coupled to one or both of the output terminals of the D class or AB class amplifier.

10. A speaker driving circuit, configured to simultaneously drive a capacitive speaker and a coil speaker, the speaker driving circuit comprising:
   a D class or AB class amplifier configured to receive an audio signal and to output an amplified signal having an output voltage according to the audio signal;
   a first drive terminal coupled to the D class or AB class amplifier for receiving the amplified signal, the first drive terminal having a voltage conversion unit and a protection and matching unit, wherein
      the voltage conversion unit is configured to boost the output voltage to a first driving voltage, which is higher than the output voltage, and provide the first driving voltage and a first driving current to the capacitive speaker according to the amplifier signal, and
      the protection and matching unit is coupled between the D class or AB class amplifier and the voltage conversion unit for impedance matching between the D class or AB class amplifier and the voltage conversion unit, the protection and matching unit configured to limit a total current flowing through the D class or AB class amplifier; and
   a second drive terminal connected to the first drive terminal in parallel and coupled to the D class or AB class amplifier, the second drive terminal configured to receive the amplified signal and to provide a second driving voltage and a second driving current to the coil speaker according to the amplified signal;
   wherein the first driving voltage is larger than the second driving voltage and the first driving current is smaller than the second driving current.

11. The speaker driving circuit as claimed in claim 10, wherein
   the first drive terminal further comprises a first sound quality adjustment unit coupled between the protection and matching unit and the D class or AB class amplifier, and
   the second drive terminal further comprises a second sound quality adjustment unit coupled to the D class or AB class amplifier.

12. The speaker driving circuit as claimed in claim 11, wherein each of the first sound quality adjustment unit and the second sound quality adjustment unit further comprises at least one of
   an equalizer, and
   an auto gain controller or a dynamic range controller.

13. The speaker driving circuit as claimed in claim 11, further comprising a third sound quality adjustment unit coupled to an input terminal of the D class or AB class amplifier.

14. The speaker driving circuit as claimed in claim 13, wherein the first sound quality adjustment unit and the second sound quality adjustment unit are equalizers, and the third sound quality adjustment unit is an auto gain controller or a dynamic range controller.

15. The speaker driving circuit as claimed in claim 10, wherein the D class or AB class amplifier has two output terminals, and the protection and matching unit is coupled to one or both of the output terminals of the D class or AB class amplifier.

* * * * *